United States Patent
Powers

(10) Patent No.: US 10,852,356 B2
(45) Date of Patent: Dec. 1, 2020

(54) METHOD FOR MAGNETIC BURST TESTING OF LARGE ELECTRIC MOTORS WITH PORTABLE TESTER POWERED BY A DOMESTIC WALL OUTLET

(71) Applicant: AVO MULTI-AMP CORPORATION, Dallas, TX (US)

(72) Inventor: Craig Powers, Fort Collins, CO (US)

(73) Assignee: AVO Multi-Amp Corporation, Dallas, TX (US)

( * ) Notice: Subject to any disclaimer, the term of this patent is extended or adjusted under 35 U.S.C. 154(b) by 0 days.

(21) Appl. No.: 16/537,176

(22) Filed: Aug. 9, 2019

(65) Prior Publication Data
US 2020/0142003 A1 May 7, 2020

Related U.S. Application Data

(63) Continuation of application No. 15/849,854, filed on Dec. 21, 2017, now Pat. No. 10,379,164.

(51) Int. Cl.
*G01R 31/34* (2020.01)
(52) U.S. Cl.
CPC .................. *G01R 31/346* (2013.01)
(58) Field of Classification Search
CPC .. G01R 31/346; G01R 22/066; G01R 15/202; G06F 19/00; G06F 11/30; G01B 5/30; G01H 11/08; H02H 7/09; H03F 2200/451; H03F 1/56
USPC ... 324/207.13–207.15, 200, 86, 167, 207.25, 324/654, 76.75, 76.11, 500, 750.16, 220
See application file for complete search history.

(56) References Cited

U.S. PATENT DOCUMENTS

| | | |
|---|---|---|
| 6,385,057 B1 | 5/2002 | Barron |
| 2018/0181099 A1* | 6/2018 | Steinbach ................ H02P 6/16 |
| 2019/0195950 A1* | 6/2019 | Powers ................ G01R 31/346 |

FOREIGN PATENT DOCUMENTS

EP        3247036 A1     11/2017

OTHER PUBLICATIONS

European Extended Search Report dated Jun. 25, 2019 for European Application No. EP 18215713.1.

* cited by examiner

*Primary Examiner* — Vincent Q Nguyen
*Assistant Examiner* — Trung Nguyen
(74) *Attorney, Agent, or Firm* — EIP US LLP

(57) ABSTRACT

A method for magnetic/impedance burst testing of large electric motors to determine broken rotor bar defect. The method providing a portable tester and includes a Signal Processor, a single-phase power source VAC, an AC/DC boost converter connected to the power source, at least one energy storage device connected to the AC to DC boost converter, a Pulse Width Modulated drive module (PWM) connected to the at least one energy storage device, and a series of at least three switches (IPM) using switch/level boost-type PWM rectification. The burst test is repeated until a full rotation of magnetic angles are tested and recorded with the Signal Processor. Rotor impedance versus magnetic angle of the full rotation is verified in order to check for failure, and broken rotor bar defect is determined when a shift in measured stator's impedance/admittance level for any of the given magnetic angles is identified by the Signal Processor.

12 Claims, 3 Drawing Sheets

METHOD FOR MAGNETIC BURST TESTING OF LARGE ELECTRIC MOTORS WITH PORTABLE TESTER POWERED BY A DOMESTIC WALL OUTLET

CROSS-REFERENCE TO RELATED APPLICATIONS

This application is a continuation of U.S. application Ser. No. 15/849,854, filed Dec. 21, 2017. The above-referenced patent application is incorporated by reference in its entirety.

BACKGROUND OF THE INVENTION

Field of the Invention

This invention relates to a method for magnetic burst testing of large motors. More particularly, to a method for magnetic burst testing of larger motors with a portable tester powered by a domestic wall outlet.

Description of the Related Technology

There is difficulty in delivering sufficient motor current to test large industrial motors using a portable tester. Prior to this invention, the tester needed to be powered by a two or three phase outlet of 220V or higher. With this invention, the tester can run broken rotor bar tests using a single-phase outlet of just 117/120 Volts.

SUMMARY

This invention provides a small portable tester powered from a wall outlet in the 15-20 amperes range to provide sufficient test current (5-10% of nameplate) to test industrial motors of several thousand horsepower for the broken rotor bar defect. In a first aspect, a method for magnetic/impedance burst testing of large electric motors is provided. The method includes providing a portable tester that provides a Signal Processor, a single-phase power source VAC, an AC to DC boost converter connected to the power source, at least one energy storage device connected to the AC to DC boost converter, a pulse width modulated drive (PWM) module connected to the at least one energy storage device, and a series of at least three switches (IPM) using switch/level boost-type PWM rectification, the IPM connected to both the 3 legs of the large electric motor and the PWM drive.

The method includes programming the PWM drive with a desired duration of output burst with the Signal Processor, programming the PWM drive with an initial magnetic test angle with the Signal Processor, programming the PWM drive with a test frequency for magnetic angle reversals with the Signal Processor, programming the Programmable Gain Amplifier with the Signal Processor to optimize the signal gain in order to prevent voltage and current signal clipping, controlling the PWM drive module with the Signal Processor to control the amplitude, magnetic angle and reversal frequency applied to the ACIM, controlling the boost converter with the Signal Processor to limit/throttle the maximum power drawn from the single-phase AC source and the power delivered to the large energy storage device to maximally charge the energy storage device, controlling the series of switches (IPM) with the CCP to prevent crowbar of the DC Buss by adding dead-time to the PWM signals and interlocking out unsafe PWM conditions, controlling the CCP with the PWM drive module to pass through only safe PWM drive conditions, controlling the charging of the at least one energy storage device with the boost converter to a maximum working voltage, sending an enable signal to the PWM drive to begin burst output from the Signal Processor, sampling a stream of measured voltage and/or currents of at least one of the motor legs during burst output with a voltage transducer and a current transducer respectively, which converts from analog to a digital A/D Converter digital number with the A/D Converter, adjusting the PWM drive with the set point level and measured voltage and/or current to maintain a desired burst level in order to compensate for sinking voltage of the at least one energy storage device applied to the programmed voltage and/or current level applied to the motor with the Signal Processor, recording the stream of digital numbers with the Signal Processor, calculating, at the end of each burst, rotor characteristics that include impedance, admittance, instantaneous power, voltage and currents for the previously applied magnetic test angle with the Signal Processor, recharging the at least one energy storage device with the boost converter until the maximum working voltage is attained, advancing the magnetic angle by N degrees to measure the response of each set of rotor bars that are in the line given magnetic angle and verify the response is the same for all magnetic angles with the Signal Processor, repeating the burst test N number of times until a full rotation of magnetic angles are tested and recorded with the Signal Processor, verifying, with the Signal Processor, rotor impedance versus magnetic angle of the full rotation in order to check for failure, and determining failure by identifying a shift in measured stator's impedance/admittance, harmonic or sub-harmonic level for any of the given magnetic angles by the Signal Processor.

A second aspect of the invention further includes using the recorded voltage and current samples to calculate the response of the rotor bars stimulated by the burst pulse for the given magnetic angle setting, harmonics, pulsation, wherein intermittently connected rotor bar defect are identified as well.

In a third aspect of the invention if the response for a given magnetic angle is different than all the other measured magnetic angles, then the construction of the rotor is not symmetrical, indicating a failure in one of the rotor bar sets probed by the magnetic angle as shown by the deviation from the normalized measurements.

In another aspect of the invention, the power source is a domestic wall outlet and/or a battery, and wherein the at least one energy storage device is a DC link capacitor and/or battery, In another aspect of the invention, the PWM drive with a test frequency for magnetic angle reversals is preferably in the range from 1 Hz to 10,000 Hz.

In another aspect of the invention, the maximum working voltage is required to charge the at least one energy storage device so that the boost converter can supply a power burst up to 8 KW.

In another aspect of the invention, the stimulus burst applied to the stator coils is magnetically coupled to the rotor coil, the response of the rotor coil to the stimulus burst is recorded, and wherein there is a short transient response that dies out in about 2½ cycles, which is then followed by a steady state response of the rotor to the burst pulse.

In another aspect of the invention, in addition to the transformer coupled impedance of the rotor as measured by the stator, the harmonic and sub-harmonic response of the rotor to the burst are measured, and when the magnetic angle of the burst pulse is rotated to probe the rotor bars that the magnetic field passes through.

In a final aspect of the invention, by rotating the magnetic field, different rotor bar sets are probed, and wherein a response of a good rotor bar set responding to a burst pulse at one magnetic field angle simulating them is identified as being different than that of broken rotor bar set probed with the magnetic angle burst pulse that stimulates them instead.

BRIEF DESCRIPTION OF THE DRAWINGS

The subject matter that is regarded as the invention is particularly pointed out and distinctly claimed in the claims at the conclusion of the specification. The foregoing and other features, and advantages of embodiments are apparent from the following detailed description taken in conjunction with the accompanying drawings in which:

DETAILED DESCRIPTION OF CERTAIN INVENTIVE EMBODIMENTS

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong. The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

System for Magnetic Burst Testing

Figure 1:
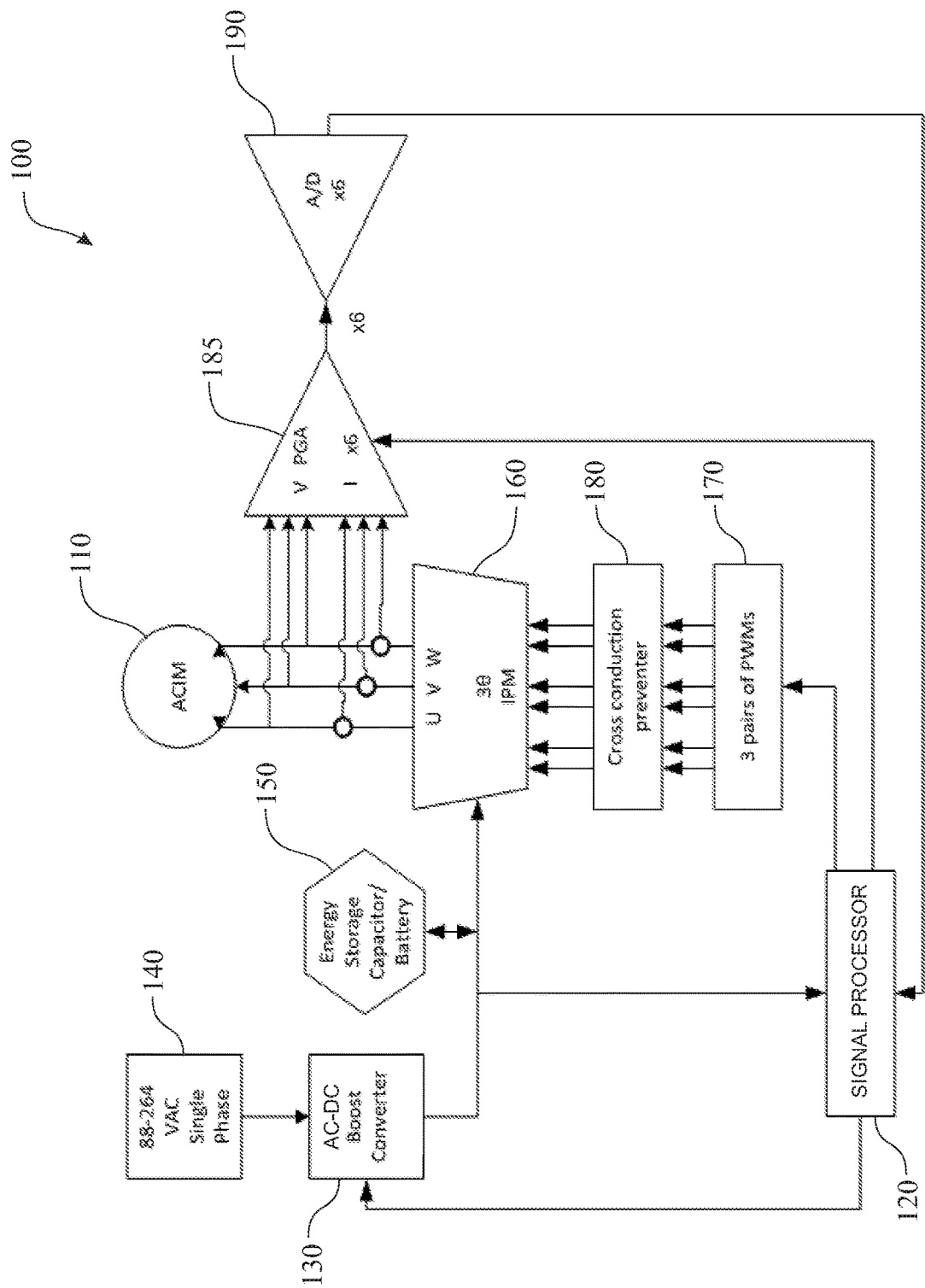
FIG. 1 illustrates a block diagram of a system for the magnetic burst testing of large electric motors according to the present invention.
Figure 2A:
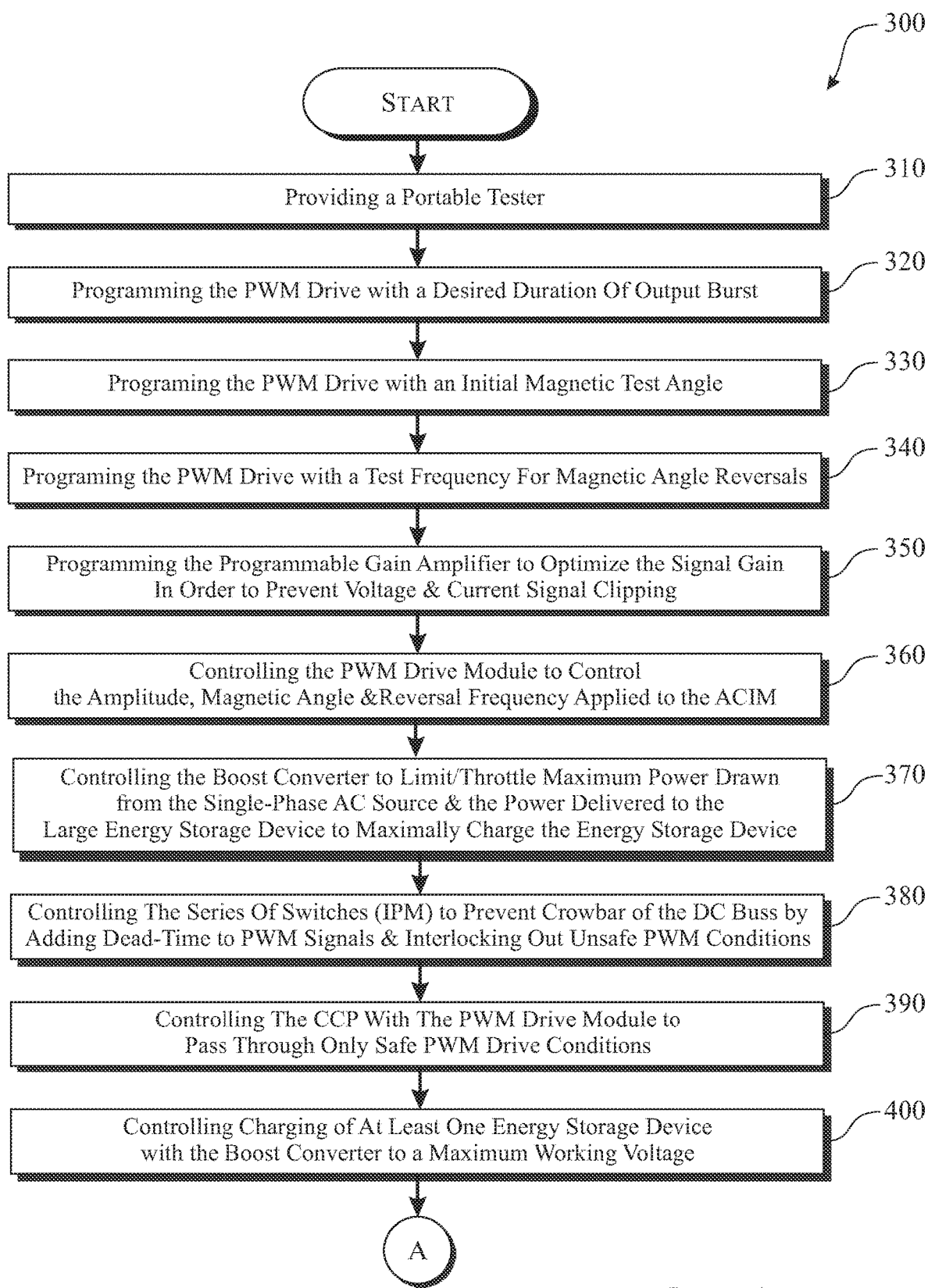
FIG. 2A illustrates a first portion of a flow diagram of a method for the magnetic burst testing of large electric motors according to the system of FIG. 1.
Figure 2B:
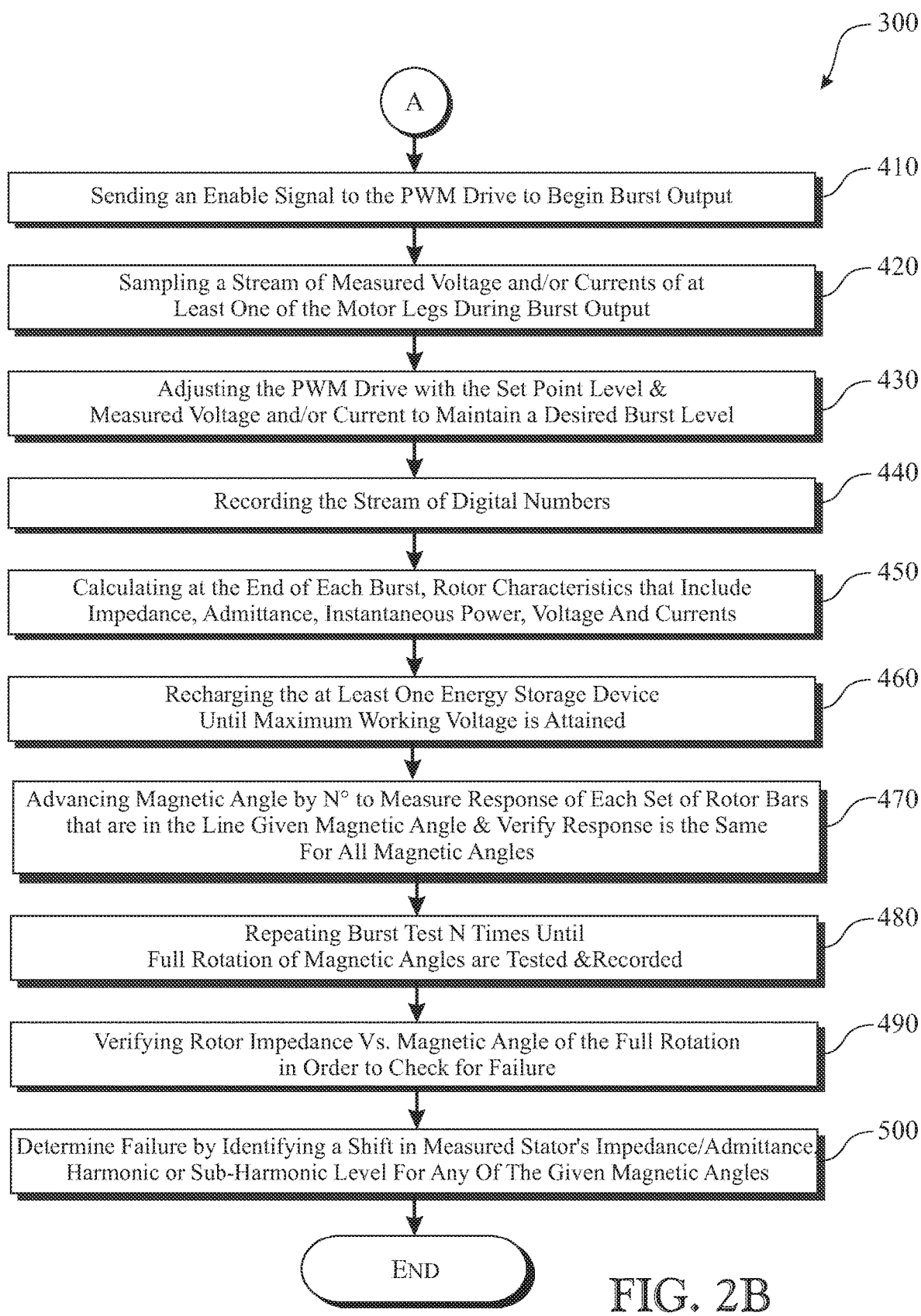
FIG. 2B illustrates a continuation of the flow diagram introduced in FIG. 2A with continuity provided by the continuity identifier A.

FIG. 1 shows a block diagram of a portable system 100 for the magnetic burst testing (broken rotor bar) of large electric motors 110. The components shown within the system 100 are generally packaged into a relatively small, portable testing unit (actual unit not shown) that can be easily transported to an equipment site. The large electric motors to be burst tested are typically AC induction motors (ACIM's) 110 that are difficult to move. Thus, the portable system 100 of the present invention provides an advantage to the industry for testing large stationary ACIM's 110 and an advantage where the test site only has an ordinary single-phase domestic power outlet of just 117/120 Volts, negating the need for a two or three phase outlet of 220V or higher and the associated specialized multi-phase high current 'industrial' extension cord needed to connect the tester to the two or three phase industrial power outlet.

The system 100 further provides an input power source 140 that is connected to an AC to DC Boost Converter 130. The input power source 140 is typically a single-phase AC power source at line voltage or 110-115 VAC. The AC to DC Boost Converter 130 is connected to at least one energy storage device 150. The power source 140 may alternately be a battery 140 suitable for use in the application. That is, a battery 140 having the capacity to repeatedly charge the energy storage device 150 until a maximum working voltage is maintained. Once the maximum working voltage for the energy storage device has been reached, the IPM 160 can simultaneously draw power from both the energy storage device 150 and the boost converter 130 to supply a power burst up to 8 KW for testing a magnetic angle. This enables one to test all classes of medium voltage ACIM's. The energy storage device 150 may need to be recharged to the maximum working voltage multiple times during a set of tests for broken rotor bar defect. As such, the battery capacity is configured to handle this required load energy for multiple recharges.

Adding an AC to DC Boost Converter 130 to the at least one energy storage device 150 enables higher DC bus link voltage operation at lower AC line voltages and increases the stored energy in the energy storage device 150. One type of energy storage device 150 could be a DC Bus Link Capacitor 150. Alternately, a high discharge rate battery 150 may provide a suitable energy storage device 150 for purposes of the invention.

The stored energy in the Bus Link Capacitor is determined by the basic equation $E = \frac{1}{2} C * (V)^2$. So for example, adding the AC to DC Boost Converter to the DC bus link capacitor enables higher DC bus link voltage operation at lower AC line voltages and increases the stored energy in bus link capacitor. Consequently, with the ability to store more energy in the energy storage device, larger ACIM's can be tested using a momentary current burst test at a given magnetic angle.

By increasing the DC bus link capacitor voltage with the boost converter, the voltage margin to drive the necessary test current through the motor can be provided as the energy is drained from the dc bus capacitor during a burst test. The duty cycle of the drive PWM can be adjusted to maintain constant motor drive test current as the energy is drained from the DC bus link during the burst test of a given magnetic test angle. The power provided by a 20 A 110V outlet supplemented by the stored energy in the DC bus link capacitor enables sufficient current [typically 5-10]% of nameplate current through the motor for a momentary burst to detect broken rotor bars in ACIM's.

The at least one energy storage device 150 is connected to an Intelligent Power Module (IPM) 160. The IPM 160 is basically a bundle of fixed power switches that are connected to the 3 legs of the ACIM 110. In addition, the IPM 160 may include a Cross-Conduction Preventer 180 as well as high and low side drivers for each power switch, isolated power converters for internal components, fault detection circuitry as well as scaled current and voltage outputs for each output leg (U, V, W) that could be connected to a Programmable Gain Amplifier (PGA) PGA 185. In addition to being connected to the ACIM, the IPM 160 is connected to the Programmable Gain Amplifier (PGA) 185 either by additional current sense resistors and voltage dividers inserted on each leg U, V and W or by scaled/conditioned current and voltage outputs provided by the IPM 160.

The programmable-gain amplifier (PGA) 185 is an electronic amplifier (typically an operational amplifier) whose gain can be controlled by external digital or analog signals. Here, the PGA 185 receives both voltage and current signals being fed by the IPM 160 to the ACIM. The PGA 185 adds gain to the signal before entering into an A/D converter 190. The A/D converter 190 provides an input that is fixed in range. Therefore, the PGA 185 is required in order to boost gain for single level compensation depending on the size and power requirements of the ACIM to be tested and the range and resolution of the chosen A/D 190.

A pulse width modulated drive module (PWM) 170 is connected to a series of at least three switches in the (IPM) 160 using switch/level boost-type PWM rectification. The amplitude of the 3 pairs of PWMs 170 are programmed by the DSP for a given magnetic angle N with the U channel set to sin(N), V set to sin(N+120) and W set to (N+240). During the Burst test for each magnetic angle, the DSP will reverse the U, W and V amplitudes at a given reversal frequency either by applying a [1,−1] amplitude modifier or sinusoidal amplitude modifier at the reversal frequency rate. The IPM is connected to both the (3) legs of the ACIM 110 and the PWM 170. The PWM 170 is connected to the IPM 160 through a Cross Conduction Preventer (CCP) 180. The CCP 180 is provided as a safety. It prevents severe damage to the system 100 if the PWM 170 is programmed incorrectly. The cross-conduction preventer ensures that each set of switches in the IPM forming a half-bridge converter have sufficient dead-time added to the PWM signals to prevent cross-conduction of the half-bridge converter switches. The dead-time added will depends upon the storage time characteristics of the particular device [FET, IGBT, GTO, etc.] implemented in the IPM 160. This "dead time" must be of sufficient duration to ensure that the "on" states of the two power switches do not overlap under any conditions.

Finally, a Signal Processor 120 is provided in order to control the function of system 100. The Signal Processor 120 controls both the PWM 170 and AC to DC Boost Converter 130 based on feedback received from the A/D converter 190 and from the energy storage device 150. The function of the Signal Processor may be provided by a single dedicated processor, by a single shared processor, or by a plurality of individual processors, some of which or all of which may be shared.

However, the term "processor" or "controller" is by far not limited to hardware exclusively capable of executing software, but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

In order to carry out the function of the system, the PWM is programmed with a desired duration of output burst by the Signal Processor. The desired duration programmed into the PWM depends on the size and power requirements of the ACIM to be tested. The PWM is further programmed with an initial magnetic test angle by the Signal Processor and with a test frequency for magnetic angle reversals by the Signal Processor. The test frequency for magnetic angle reversals is preferably in the range from 1 Hz to 10,000 Hz. The test frequency includes a large range because it depends on iron depth penetration of the magnetic field, which varies with the size of ACIM. The magnetic field of a lower reversal test frequency penetrates deeper into the iron of a rotor whereas a higher reversal test frequency only affects the top surface of a rotor much as the 'skin depth' penetration of a RF field decreases with increasing frequency.

Finally, the PGA is programmed by the Signal Processor to optimize the signal gain in order to prevent voltage and current signal clipping. In addition, the PGA gain optimizes the signal to noise ratio of the signal and reduce quantization artifacts. The PWM is controlled by the Signal Processor to control the amplitude, magnetic angle and reversal frequency applied to the ACIM. In addition, the boost converter is controlled with the Signal Processor to limit/throttle the maximum power drawn from the single-phase AC source/battery 140 and the power delivered to the large energy storage device 150 to maximally charge the energy storage device.

The series of switches in the IPM is controlled with the CCP to prevent crowbar of the DC Buss by adding dead-time to the PWM signals and interlocking out unsafe PWM conditions. The CCP is controlled with the PWM drive module to pass through only safe PWM drive conditions. Finally, the charging of the at least one energy storage device is controlled by the boost converter to obtain a maximum working voltage.

An enable signal from the Signal Processor is first sent to the PWM drive to begin burst output from the Signal Processor. Then, a stream of measured voltage and/or currents of at least one of the motor legs during burst output with a voltage transducer and a current transducer respectively are sampled. The sampled stream is converted from an analog measured value to a digital number within the A/D Converter. A resistive voltage divider network placed on each motor leg may be provided to scale down the burst test voltage to a level that an analog to digital converter can sample using the Signal Processor. A series resistor, hall effect device or current transformer placed on each motor leg may be provided to convert the test current to a proportional voltage that an analog to digital converter can sample using the Signal Processor.

The PWM drive is adjusted with a set point level and measured voltage and/or current to maintain a desired burst level. This is essentially an electrical feedback loop that is used to push the output drive to a desired set-point in order to compensate for sinking voltage of the at least one energy storage device 150 applied to the programmed voltage and/or current level applied to the motor with the Signal Processor 120. The stream of digital numbers is then recorded within the Signal Processor.

The stimulus burst applied to the stator coil of the ACIM is magnetically coupled to the rotor coil. The response of the rotor coil to the stimulus burst is then recorded as previously disclosed. There is a short transient response thereafter that dies out in about 2½ cycles. This is followed by a steady state response of the rotor to the burst pulse. Here, after the transient dies out the system then focuses on the steady state response.

At the end of each burst, rotor characteristics that include impedance, admittance, instantaneous power (I squared r), voltage and currents for the previously applied magnetic test angle are calculated within the Signal Processor. The at least one energy storage device is recharged by the boost converter until the maximum working voltage is attained once again. The Signal Processor advances the magnetic angle by N degrees to measure the response of each set of rotor bars that are in the line given magnetic angle and verify that the response is the same for all magnetic angles. The Signal Processor repeats the burst test by N number of times until a full rotation of magnetic angles are tested and recorded in a memory within the Signal Processor.

The Signal Processor verifies rotor impedance versus magnetic angle of the full rotation in order to check for failure. Broken rotor bar defect is determined when a shift in measured stator's impedance/admittance (Resistance and inductance), for any of the given magnetic angles is identified by the Signal Processor. In an alternate embodiment, the recorded voltage and current samples used to calculate the response of the rotor bars stimulated by the burst pulse for the given magnetic angle setting, may provide harmonic or sub-harmonic level harmonics, pulsation, etc. That is, not only impedance could be verified, but for intermittently connected rotor bar as well By rotating the magnetic field, different rotor bar sets may be probed. A response of a good rotor bar set responding to a burst pulse at one magnetic field angle simulating them is identified as being different than that of broken rotor bar set probed with the magnetic angle burst pulse that stimulates them instead. Consequently, it is clear that different responses are obtained between a good rotor bar response versus a bad rotor bar response.

Further, if the response for a given magnetic angle is different than all the other measured magnetic angles, then the construction of the rotor is not symmetrical. As such, a failure in one of the rotor bar sets probed by the magnetic angle is shown by the deviation from the normalized measurements. Consequently, rotor porosity problems could also be detected.

In addition to the transformer coupled impedance of the rotor as measured by the stator, the harmonics and subharmonic response of the rotor to the burst are measured. Here, the magnetic angle of the burst pulse is rotated to probe the rotor bars that the magnetic field passes through. Consequently, additional harmonics and sub-harmonic response can be beneficial in determining faults.

Method for Magnetic Burst Testing

A method 300 for magnetic/impedance burst testing of large electric motors will now be disclosed. The method 300 includes providing 310 the portable tester having the Signal Processor, the single-phase power source VAC, the AC to DC boost converter connected to the power source, at least one energy storage device connected to the AC to DC boost converter, the pulse width modulated drive (PWM) module connected to the at least one energy storage device, and the series of at least three switches (IPM) using switch/level boost-type PWM rectification, the IPM being connected to both the 3 legs of the large electric motor and the PWM drive.

The method further provides the following programming steps that are required in order to carry out the method. They include a step of programming the PWM drive 320 with a desired duration of output burst, programing the PWM drive 330 with an initial magnetic test angle, programing the PWM drive 340 with a test frequency for magnetic angle reversals, and programming the Programmable Gain Amplifier 350 to optimize the signal gain in order to prevent voltage and current signal clipping. All of the aforementioned programming steps are carried out by the Signal Processor.

The method provides the following controlling steps that are required to control the method. They include a step of controlling the PWM drive module 360 to control the amplitude, magnetic angle and reversal frequency applied to the ACIM, controlling the boost converter 370 with the Signal Processor to limit/throttle the maximum power drawn from the single-phase AC source and the power delivered to the large energy storage device to maximally charge the energy storage device, controlling the series of switches (IPM) 380 with the CCP to prevent crowbar of the DC Buss by adding dead-time to the PWM signals and interlocking out unsafe PWM conditions, controlling the CCP 390 with the PWM drive module to pass through only safe PWM drive conditions, and controlling the charging of the at least one energy storage device 400 with the boost converter to a maximum working voltage.

The method then provides a step of sending an enable signal 410 to the PWM drive to begin burst output from the Signal Processor. Further, a step of sampling a stream of measured voltage and/or currents of at least one of the motor legs 420 during burst output with the voltage transducer and the current transducer respectively is provided. This converts from the analog to the digital A/D Converter digital number with the A/D Converter.

Next, a step of adjusting 430 the PWM drive with the set point level and measured voltage and/or current to maintain a desired burst level (electrical feedback loop to push the output drive to a desired set-point) in order to compensate for sinking voltage of the at least one energy storage device applied to the programmed voltage and/or current level applied to the motor with the Signal Processor is carried out. A step of recording the stream of digital numbers 440 with the Signal Processor is carried out.

The method includes calculating, at the end of each burst, rotor characteristics 450 that may include impedance, admittance, instantaneous power, voltage and currents for the previously applied magnetic test angle with the Signal Processor, Subsequently, a step of recharging 460 the at least one energy storage device with the boost converter until the maximum working voltage is attained is then undertaken. In step 470, advancing the magnetic angle by N degrees to measure the response of each set of rotor bars that are in the line given magnetic angle and verify the response is the same for all magnetic angles with the Signal Processor is started. In step 480, repeating the burst test N number of times until a full rotation of magnetic angles are tested and recorded with the Signal Processor is started.

In step 490 verifying, with the Signal Processor, rotor impedance versus magnetic angle of the full rotation in order to check for failure is initiated, and finally, in step 500 determining failure by identifying a shift in measured stator's impedance/admittance, harmonic or sub-harmonic level for any of the given magnetic angles is accomplished by the Signal Processor.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

Furthermore, the following claims are hereby incorporated into the detailed description, where each claim may stand on its own as a separate example. While each claim may stand on its own as a separate example, it is to be noted that a dependent claim may refer in the claims to a specific combination with one or more other claims.

Other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A method for magnetic/impedance burst testing of electric motors comprising:
   providing a portable tester that provides a Signal Processor, a single-phase power source VAC, an AC to DC boost converter connected to the power source, at least one energy storage device connected to the AC to DC boost converter, a pulse width modulated drive (PWM) module connected to the at least one energy storage device, and a series of at least three switches (IPM) using switch/level boost-type PWM rectification, the IPM connected to both the 3 legs of the large electric motor and the PWM drive, the method comprising:
   programming the PWM drive with a desired duration of output burst with the Signal Processor;
   programming the PWM drive with an initial magnetic test angle with the Signal Processor;
   programming the PWM drive with a test frequency for magnetic angle reversals with the Signal Processor;
   programming the Programmable Gain Amplifier with the Signal Processor to optimize the signal gain in order to prevent voltage and current signal clipping; and
   controlling the PWM drive module with the Signal Processor to control the amplitude, magnetic angle and reversal frequency applied to the electric motor (ACIM).

2. A method according to claim 1, comprising:
   controlling the boost converter with the Signal Processor to limit/throttle the maximum power drawn from the single-phase AC source and the power delivered to the large energy storage device to maximally charge the energy storage device.

3. A method according to claim 1, comprising controlling the series of switches (IPM) with a cross conduction preventer (CCP) to prevent crowbar of the DC Buss by adding dead-time to the PWM signals and interlocking out unsafe PWM conditions, and
   controlling the CCP with the PWM drive module to pass through only safe PWM drive conditions.

4. A method according to claim 1, comprising controlling the charging of the at least one energy storage device with the boost converter to a maximum working voltage,
   sending an enable signal to the PWM drive to begin burst output from the Signal Processor, and
   sampling a stream of measured voltage and/or currents of at least one of the motor legs during burst output with a voltage transducer and a current transducer respectively, which converts from analog to a digital A/D Converter digital number with the A/D Converter.

5. A method according to claim 4, comprising adjusting the PWM drive with a set point level and measured voltage and/or current to maintain a desired burst level in order to compensate for sinking voltage of the at least one energy storage device applied to the programmed voltage and/or current level applied to the motor with the Signal Processor:
   recording the stream of digital numbers with the Signal Processor; and
   calculating, at the end of each burst, rotor characteristics that include impedance, admittance, instantaneous power, voltage and currents for the previously applied magnetic test angle with the Signal Processor.

6. A method according to claim 1, comprising:
   recharging the at least one energy storage device with the boost converter until a maximum working voltage is attained,
   advancing the magnetic angle by N degrees to measure the response of each set of rotor bars that are in the line given magnetic angle and verify the response is the same for all magnetic angles with the Signal Processor,
   repeating the burst test N number of times until a full rotation of magnetic angles are tested and recorded with the Signal Processor,
   verifying, with the Signal Processor, rotor impedance versus magnetic angle of the full rotation in order to check for failure, and
   determining failure by identifying a shift in measured stator's impedance/admittance, harmonic or sub-harmonic level for any of the given magnetic angles by the Signal Processor.

7. A system for magnetic/impedance burst testing of electric motors to determine broken rotor bar defect, the system being encased in a portable tester and comprising:
   a Signal Processor;
   a single-phase power source VAC;
   an AC to DC boost converter connected to the power source;
   at least one energy storage device connected to the AC to DC boost converter;
   a Pulse Width Modulated drive module (PWM) connected to the at least one energy storage device; and
   a series of at least three switches (IPM) using switch/level boost-type PWM rectification, the IPM connected to both the 3 legs of the large electric motor and the PWM drive, wherein
   the PWM is programmed with a desired duration of output burst by the Signal Processor;
   the PWM is programmed with an initial magnetic test angle by the Signal Processor, the PWM is programmed with a test frequency for magnetic angle reversals by the Signal Processor;
   the programmable Gain Amplifier is programmed by the Signal Processor to optimize the signal gain in order to prevent voltage and current signal clipping; and the PWM is controlled by the Signal Processor to control the amplitude, magnetic angle and reversal frequency applied to the electric motor (ACIM).

8. A system according to claim 7, wherein:

the boost converter is controlled by the Signal Processor to limit/throttle the maximum power drawn from the single-phase AC source and the power delivered to the large energy storage device to maximally charge the energy storage device.

9. A system according to claim 7, wherein:

the series of switches IPM is controlled by a cross conduction preventer (CCP) to prevent crowbar of the DC Buss by adding dead-time to the PWM signals and interlocking out unsafe PWM conditions, the CCP is controlled by the PWM drive module to pass through only safe PWM drive conditions.

10. A system according to claim 7, wherein:

the charging of the at least one energy storage device is controlled by the boost converter to a maximum working voltage;

an enable signal to the PWM drive to begin burst output is sent from the Signal Processor; and a stream of measured voltage and/or currents of at least one of the motor legs during burst output are sampled with at least one voltage transducer and at least one current transducer respectively, which converts from analog to a digital A/D Converter digital number with the A/D Converter.

11. A system according to claim 10, wherein:

the PWM drive is adjusted with a set point level and measured voltage and/or current to maintain a desired burst level in order to compensate for sinking voltage of the at least one energy storage device applied to the programmed voltage and/or current level applied to the large electric motors with the Signal Processor, the stream of digital numbers are stored within the Signal Processor, at the end of each burst, rotor characteristics that include impedance, admittance, instantaneous power (I squared r), voltage and currents for the previously applied magnetic test angle are calculated by the Signal Processor.

12. A system according to claim 7, wherein:

the at least one energy storage device is recharged by the boost converter until a maximum working voltage is re-attained;

the magnetic angle is advanced by N degrees to measure the response of each set of rotor bars that are in the line given magnetic angle and verify the response is the same for all magnetic angles with the Signal Processor;

the burst test is repeated N number of times until a full rotation of magnetic angles are tested and recorded with the Signal Processor;

the Signal Processor verifies the rotor impedance versus magnetic angle of the full rotation in order to check for failure, and wherein broken rotor bar defect is determined when a shift in measured stator's impedance/admittance, harmonic or subharmonic level for any of the given magnetic angles is identified by the Signal Processor.

* * * * *